(12) United States Patent
Hussaini et al.

(10) Patent No.: US 10,100,415 B2
(45) Date of Patent: Oct. 16, 2018

(54) MULTI-JUNCTION ARTIFICIAL PHOTOSYNTHETIC CELL WITH ENHANCED PHOTOVOLTAGES

(71) Applicants: Syed Mubeen Jawahar Hussaini, Iowa City, IA (US); Eric W. McFarland, Santa Barbara, CA (US); Martin Moskovits, Santa Barbara, CA (US); Joun Lee, Iowa City, IA (US); Tim Young, Santa Barbara, CA (US)

(72) Inventors: Syed Mubeen Jawahar Hussaini, Iowa City, IA (US); Eric W. McFarland, Santa Barbara, CA (US); Martin Moskovits, Santa Barbara, CA (US); Joun Lee, Iowa City, IA (US); Tim Young, Santa Barbara, CA (US)

(73) Assignee: HYPERSOLAR, INC., Santa Barbara, CA (US)

( * ) Notice: Subject to any disclaimer, the term of this patent is extended or adjusted under 35 U.S.C. 154(b) by 585 days.

(21) Appl. No.: 14/659,243

(22) Filed: Mar. 16, 2015

(65) Prior Publication Data

US 2016/0076154 A1    Mar. 17, 2016

Related U.S. Application Data

(60) Provisional application No. 61/968,598, filed on Mar. 21, 2014.

(51) Int. Cl.
*C25B 1/00* (2006.01)
*C25B 3/04* (2006.01)
(Continued)

(52) U.S. Cl.
CPC ............... *C25B 1/003* (2013.01); *C25B 1/04* (2013.01); *C25B 3/04* (2013.01); *C25B 9/00* (2013.01);
(Continued)

(58) Field of Classification Search
CPC .............. C25B 1/003; C25B 1/00; C25B 9/00
(Continued)

(56) References Cited

U.S. PATENT DOCUMENTS 3,924,139 A    12/1975    Hirose et al.
3,925,212 A    12/1975    Tchernev
(Continued)

OTHER PUBLICATIONS

US 4,802,963, Khan et al. (withdrawn)
(Continued)

*Primary Examiner* — Zulmariam Mendez
(74) *Attorney, Agent, or Firm* — Workman Nydegger (57) ABSTRACT

A multi-junction artificial photosynthetic unit includes an active element with a plurality of semiconducting layers, with metal layers deposited between the semiconductor layers appropriately forming Schottky barrier junctions or ohmic junctions with a surface of an adjacent semiconductor layer. The active element is formed within a protective structure formed of porous aluminum oxide. Successive layers of the active element can be formed within the protective structure, and additional layers and junctions can be added until desired photovoltages are achieved. A photoreactor for the production of fuels and chemicals driven by solar-powered redox reactions includes a bag reactor filled with a feedstock solution. A plurality of multi-junction photosynthetic units are placed in the feedstock solution to drive the redox reactions and produce the desired fuels and chemicals.

18 Claims, 8 Drawing Sheets

(51) Int. Cl.
  *C25B 1/04* (2006.01)
  *C25B 9/00* (2006.01)
  *H01G 9/20* (2006.01)
  *H01L 31/0224* (2006.01)
  *H01L 31/048* (2014.01)
  *H01L 31/07* (2012.01)
  *H01L 31/0725* (2012.01)
  *H01L 31/073* (2012.01)
  *H01L 31/0749* (2012.01)

(52) U.S. Cl.
  CPC ....... *H01G 9/20* (2013.01); *H01L 31/022425* (2013.01); *H01L 31/0481* (2013.01); *H01L 31/07* (2013.01); *H01L 31/073* (2013.01); *H01L 31/0725* (2013.01); *H01L 31/0749* (2013.01); *Y02E 60/366* (2013.01); *Y02E 70/10* (2013.01)

(58) Field of Classification Search
  USPC ........................................................ 204/248
  See application file for complete search history.

(56) References Cited

U.S. PATENT DOCUMENTS

| | | | |
|---|---|---|---|
| 3,998,659 A | 12/1976 | Wakefield | |
| 4,011,149 A | 3/1977 | Nozik | |
| 4,021,323 A | 5/1977 | Kilby et al. | |
| 4,069,120 A | 1/1978 | Meyerand, Jr. et al. | |
| 4,090,933 A | 5/1978 | Nozik | |
| 4,094,751 A | 6/1978 | Nozik | |
| 4,100,051 A | 7/1978 | Kilby et al. | |
| 4,136,436 A | 1/1979 | Kilby et al. | |
| 4,140,603 A | 2/1979 | Gomberg | |
| 4,173,494 A | 11/1979 | Johnson et al. | |
| 4,175,016 A | 11/1979 | Lewis et al. | |
| 4,203,814 A | 5/1980 | Grantham | |
| 4,215,182 A | 7/1980 | Ang et al. | |
| 4,224,081 A | 9/1980 | Kawamura et al. | |
| 4,236,984 A | 12/1980 | Grantham | |
| 4,263,110 A | 4/1981 | Meyerand, Jr. | |
| 4,263,111 A | 4/1981 | Hooper et al. | |
| 4,270,263 A | 6/1981 | Johnson et al. | |
| 4,315,973 A | 2/1982 | Manassen et al. | |
| 4,357,400 A | 11/1982 | Appleby | |
| 4,381,233 A | 4/1983 | Adachi et al. | |
| 4,419,278 A | 12/1983 | Gordon | |
| 4,427,749 A | 1/1984 | Graetzel et al. | |
| 4,437,954 A | 3/1984 | Sammells et al. | |
| 4,466,869 A | 8/1984 | Ayers | |
| 4,484,992 A | 11/1984 | Buhler et al. | |
| 4,525,436 A | 6/1985 | Yamazaki | |
| 4,533,608 A | 8/1985 | Somorjai et al. | |
| 4,595,568 A | 6/1986 | Van Damme et al. | |
| 4,643,817 A | 2/1987 | Appleby | |
| 4,722,776 A | 2/1988 | Murphy et al. | |
| 4,790,916 A | 12/1988 | Murphy et al. | |
| 4,889,604 A | 12/1989 | Khan et al. | |
| 5,116,582 A | 5/1992 | Cooper et al. | |
| 5,118,422 A | 6/1992 | Cooper | |
| 5,262,023 A | 11/1993 | Arakawa | |
| 5,449,467 A | 9/1995 | Yokoi | |
| 5,581,091 A | 12/1996 | Xu et al. | |
| 5,865,960 A | 2/1999 | Park et al. | |
| 6,017,425 A | 1/2000 | Park et al. | |
| 6,060,026 A | 5/2000 | Goldstein | |
| 6,077,497 A | 6/2000 | Park et al. | |
| 6,204,545 B1 | 3/2001 | Nakata | |
| 6,294,822 B1 | 9/2001 | Nakata | |
| 6,297,190 B1 | 10/2001 | Park et al. | |
| 6,300,274 B1 | 10/2001 | Park et al. | |
| 6,315,870 B1 | 11/2001 | Tabatabaie-Raissi et al. | |
| 6,361,660 B1 | 3/2002 | Goldstein | |
| 6,508,941 B2 | 1/2003 | Meyer et al. | |
| 6,517,806 B2 | 2/2003 | Park et al. | |
| 6,827,911 B1 | 12/2004 | Gering | |
| 6,828,273 B2 | 12/2004 | Tanaka et al. | |
| 6,838,413 B2 | 1/2005 | Domen et al. | |
| 6,864,211 B2 | 3/2005 | Domen et al. | |
| 6,878,666 B2 | 4/2005 | Domen et al. | |
| 6,911,082 B2 | 6/2005 | Sato et al. | |
| 7,008,473 B2 | 3/2006 | Butters et al. | |
| 7,033,566 B2 | 4/2006 | Arakawa et al. | |
| 7,052,587 B2 | 5/2006 | Gibson et al. | |
| 7,193,098 B1 | 3/2007 | Lucey et al. | |
| 7,205,626 B1 | 4/2007 | Nakata | |
| 7,271,334 B2 | 9/2007 | Gratzel et al. | |
| 7,318,915 B2 | 1/2008 | Jordan et al. | |
| 7,335,620 B2 | 2/2008 | Hagihara et al. | |
| 7,422,696 B2 | 9/2008 | Mirkin et al. | |
| 7,459,065 B2 | 12/2008 | Kelly et al. | |
| 7,579,296 B2 | 8/2009 | Naganuma et al. | |
| 7,608,557 B2 | 10/2009 | Tohji et al. | |
| 7,625,835 B2 | 12/2009 | Li et al. | |
| 7,704,914 B2 | 4/2010 | Tohji et al. | |
| 7,713,912 B2 | 5/2010 | Liu et al. | |
| 7,763,149 B2 | 7/2010 | Maggard | |
| 7,820,022 B2 | 10/2010 | McNulty et al. | |
| 7,851,338 B2 | 12/2010 | Alivisatos et al. | |
| 7,909,979 B2 | 3/2011 | Yamada et al. | |
| 8,003,563 B2 | 8/2011 | Sato et al. | |
| 2002/0187082 A1 | 12/2002 | Wu et al. | |
| 2005/0178649 A1 | 8/2005 | Liedy | |
| 2006/0063668 A1 | 3/2006 | Tseng et al. | |
| 2007/0177372 A1 | 8/2007 | Matsuda et al. | |
| 2007/0275851 A1 | 11/2007 | Sasano et al. | |
| 2008/0302669 A1 | 12/2008 | Peters et al. | |
| 2009/0148359 A1 | 6/2009 | Shao et al. | |
| 2009/0192032 A1 | 7/2009 | Cho et al. | |
| 2009/0321244 A1 | 12/2009 | Smith et al. | |
| 2010/0003169 A1 | 1/2010 | Foster et al. | |
| 2010/0044209 A1 | 2/2010 | Banin et al. | |
| 2010/0176067 A1 | 7/2010 | Boyd et al. | |
| 2010/0184592 A1 | 7/2010 | Sepeur et al. | |
| 2010/0203609 A1 | 8/2010 | Yacoby et al. | |
| 2010/0204041 A1 | 8/2010 | Nakano et al. | |
| 2011/0045964 A1 | 2/2011 | Abe et al. | |
| 2011/0082026 A1 | 4/2011 | Sakatani et al. | |
| 2011/0123423 A1 | 5/2011 | Ciambelli et al. | |

OTHER PUBLICATIONS

International Search Report and Written Opinion in PCT/US2015/021059 dated Jul. 2, 2015.

Mubeen et al., Synthesis of Chemicals Using Solar Energy with Stable Photoelecrochemically Active Heterostructures. Nano. Lett., 13, 2110-2115, Apr. 15, 2013 (Apr. 15, 2013), Fig 2; p. 2111; abstract.

"Solar Cells" Solar Radiation and Ideal Conversion Efficiency, Physics of Semiconductor Devices, $2^{nd}$ Edition, pp. 790-839, 1981.

MULTI-JUNCTION ARTIFICIAL PHOTOSYNTHETIC CELL WITH ENHANCED PHOTOVOLTAGES

CROSS-REFERENCE TO RELATED APPLICATIONS

This application claims the benefit of U.S. Provisional Application No. 61/968,598 filed Mar. 21, 2014, the disclosure of which is incorporated herein in its entirety.

BACKGROUND

1. Field of the Invention

Disclosed herein are photoelectrocatalytic devices and methods, including multi-junction artificial photosynthetic components and methods of use and manufacture thereof.

2. Description of the Related Art

Development of an inexpensive solar fuel conversion process for the cleavage of water and $CO_2$ reduction could potentially generate fuels or industrial chemicals with net zero carbon emissions. Based on the thermodynamic requirements alone, solar radiation with photon energies greater than 1.23 electron-volts is required to split water or to reduce $CO_2$ to fuels. However, water oxidation at photo-anode is a kinetically sluggish process and likewise $CO_2$ reduction at photo-cathode needs high overpotentials, resulting in actual energy requirements greater than 2.0 V. Therefore, using a single light absorber unit for water splitting or $CO_2$ reduction requires a semiconductor with large band gap (Eg>2.5 eV), limiting the exploitation of a substantial portion of the solar spectrum.

Several strategies have been pursued to increase the obtainable phovoltages while maximizing sunlight absorption. One strategy is the use of multijunction/tandem photovoltaic designs to convert a large portion of the terrestrial solar spectrum into high free energy materials that can be used as fuels and chemicals. It has been estimated that these strategies are capable of achieving ~18% solar-to-hydrogen conversion efficiencies. Rocheleau, R. & Miller, E. *Energy Fuels* 12, 3 (1998). Indeed, John Turner and his colleagues have already demonstrated a solar-to-H2 conversion efficiency of 12.4% using multi junction III-V semiconductors in 1990's. Khaselev, O. & Turner, J. *Science* 280, 425 (1998). However, the high costs and complexities associated with device fabrication using triple junction a-Si, (Weber, M. & Dignam, M. *J. Electrochem. Soc.* 131 (1984)), and III-V semiconductors have prevented from commercial realization. Moreover, their stable operation in harsh electrochemical conditions for long hours remains insufficient.

Accordingly, there has been and remains a need to find reliable photoelectrochemical devices and methods for novel, carbon-neutral energy cycles using only sunlight as the energy input for solar-driven production of fuels and chemicals. Such devices and methods should be able to provide sufficient photovoltages while maximizing sunlight absorption. In addition, such devices and methods should resist the corrosive effects of a harsh electrochemical environment.

SUMMARY OF THE INVENTION

Disclosed herein are multi-junction photosynthetic units with novel architecture from simple low-cost electrochemical approaches. The embodiments disclosed herein provide sufficient free energy to split water and/or reduce $CO_2$ to fuels and chemicals in an efficient and stable manner.

Certain embodiments include the use of low-cost synthetic techniques to obtain semiconductor materials with designed composition, size and shape control. Certain embodiments include semiconductor materials containing earth abundant elements. Certain embodiments include a nano porous aluminum oxide template to create fault-tolerant systems that defy photo-corrosion and other degradative effects of a harsh electrochemically active environment.

Certain embodiments include methods of fabricating high efficiency low-cost multijunction photovoltaic devices using simple electrochemical routes to increase a photoelectrochemical cell's voltages for driving the desired electrochemical processes.

Certain embodiments include a multi-junction artificial photosynthesis unit including a protective structure and an active element formed within the protective structure, the active element including first and second semiconductor layers and one or more metal layers disposed between the semiconductor layers, each metal layer forming a Schottky barrier junction or an ohmic junction with a surface of an adjacent semiconductor layer.

Certain embodiments include a multi-junction artificial photosynthesis unit having a plurality of vertically stacked semiconductor layers formed within a protective structure (e.g., a porous aluminum oxide structure). The multi-junction photosynthesis unit also includes a plurality of metal layers, with one or more metal layers interstitially disposed between each semiconductor layer and configured to forma a Schottky barrier or an ohmic junction with a surface of an adjacent semiconductor layer.

Certain embodiments include a multi-junction artificial photosynthesis unit having a plurality of semiconductor layers, with each successive semiconductor layer having a greater thickness than the preceding semiconductor layer, the photogenerated current density produced over each layer being substantially equal.

Certain embodiments include a multi-junction artificial photosynthesis unit having a plurality of semiconductor layers, with each successive semiconductor layer having a different composition and producing a successively smaller energy bandgap, the photogenerated current density produced over each layer being substantially equal.

Certain embodiments of a multi-junction artificial photosynthesis unit include one or more oxidation/reduction electrocatalysts capping the unit, an ion-selective membrane covering the electrocatalyst(s), and/or a protective layer that covers and protects the unit.

BRIEF DESCRIPTION OF THE DRAWINGS

To further clarify the above and other advantages and features of the present disclosure, a more particular description of the invention will be rendered by reference to specific embodiments thereof which are illustrated in the appended drawings. It is appreciated that these drawings depict only illustrated embodiments of the invention and are therefore not to be considered limiting of its scope. Embodiments of the invention will be described and explained with additional specificity and detail through the use of the accompanying drawings in which.

DETAILED DESCRIPTION

I. Artificial Photosynthetic Unit Overview

Figure 1:
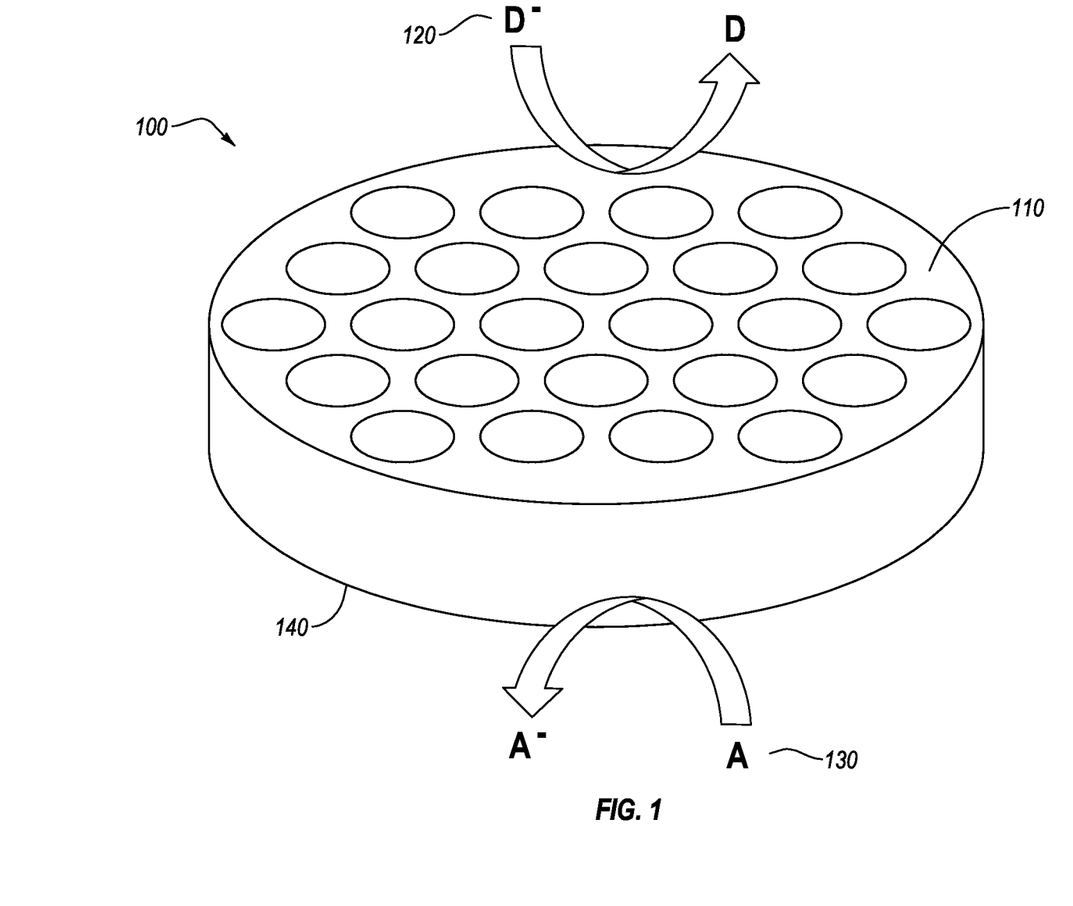
FIG. 1 illustrates an exemplary multi-junction photosynthetic unit showing photo-catalyzed oxidation and reduction reactions.

An exemplary multi-junction photosynthetic unit 100 is shown in FIG. 1. The illustrated embodiment is a self-contained photocatalytic nanoreactor unit by which solar photons are transformed into electronic excitations which can be separated into electrons and holes which will move to the catalyst/electrolyte interface 110 of the structure and transfer to acceptor/donor surface species 120, 130. To prevent the oxidation from scavenging the electrons (via back reaction), a coating permeable to H+ and $H_2$ (for water splitting) and $CO_2$ (for $CO_2$ reduction) can be applied to the outer surface of the cathodic end 140 of the structure. Effectively, this moves the expensive ion-selective membrane used in most water splitting systems and electrolyzers to the surface of the catalyst.

Figure 2:
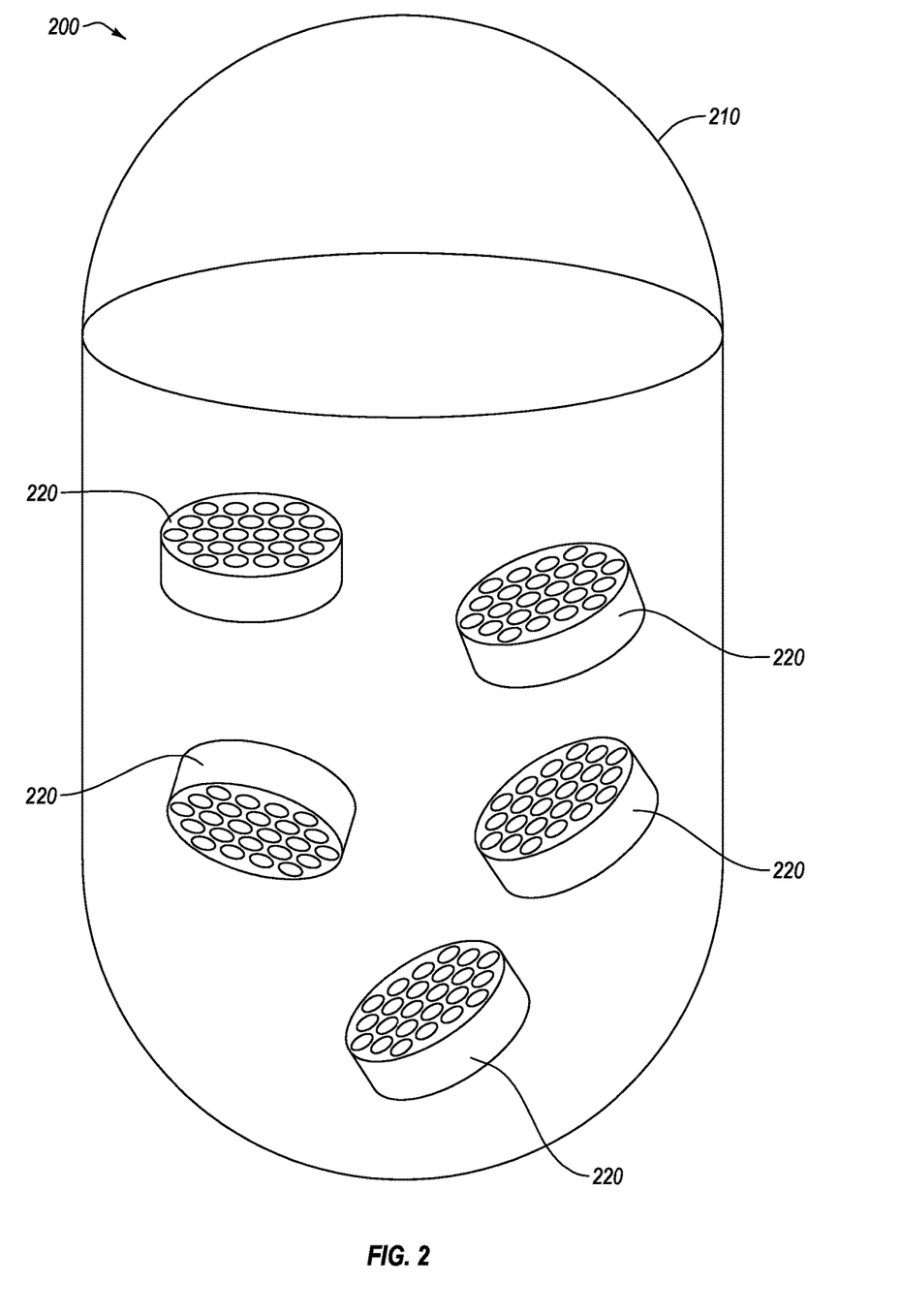
FIG. 2 illustrates a photoreactor system including a plurality of multi-junction photosynthetic units suspended in an electrolyte.

FIG. 2 illustrates an embodiment of a photoreactor system 200 formed as a reactor vessel 210 including a plurality of multi-junction photosynthetic units 220 suspended in an electrolyte 230. When operating, the multi-junction photosynthetic units 220 can be suspended in a suitable electrolyte 230 contained in a photoreactor vessel 210. In some embodiments, the vessel 210 can be a low-cost flexible plastic bag.

The electrolyte 230 can include a feedstock chemical, and the multi-junction photosynthetic unit(s) can be fully or partially submerged in the feedstock chemical. The feedstock can include water which on photoelectrolysis produces $H_2$ and $O_2$. The feedstock can include at least one waste stream (e.g., from complex organic chemical industries, pharmaceutical processing, pesticide manufacturing, hydrocarbon refining, detergents, plastics, pulp and paper mills, textile dyes, agricultural, biofuels, chemical manufacturing, toxic hydrogen sulfide, hydrogen bromide, hydrogen chloride, municipal wastewater, iron and steel industry, coal plants, and tannery). The feedstock can include chemical substances (e.g., organic molecules, inorganic molecules, celluloses, hydrocarbons, non-biocompatible pollutants, alcohols, ethanol, methanol, isopropyl alcohol, pesticides, glucose, phenols, carboxylic acids, cyanide, ammonia, acetic acid, dyes, surfactants, chlorophenols, anilines, oxalic acid, and tartaric acid).

Operation of such a photoreactor gives rise to oxidized reaction co-product(s). Such oxidized co-products can include chemical substance such as: biodegradable products produced from non-biodegradable organic waste streams, biocompatible organics which can be biologically treated in a downstream process, oxalic acid, halogens, bromine, sulfur, chlorine, and detoxified water. Hydrogen gas can react with carbon dioxide in this photosynthetic reactor to form one or more reduction products that include methane and water as co-products. In cases where water is a co-product, the water can be recycled back into the reaction mixture used to form hydrogen gas. Hydrogen gas can also react with carbon dioxide in this photosynthetic reactor to form methanol and water as co-products, or to form carbon monoxide and water as co-product.

II. Protective Structures & Layer Deposition

Figure 3A:
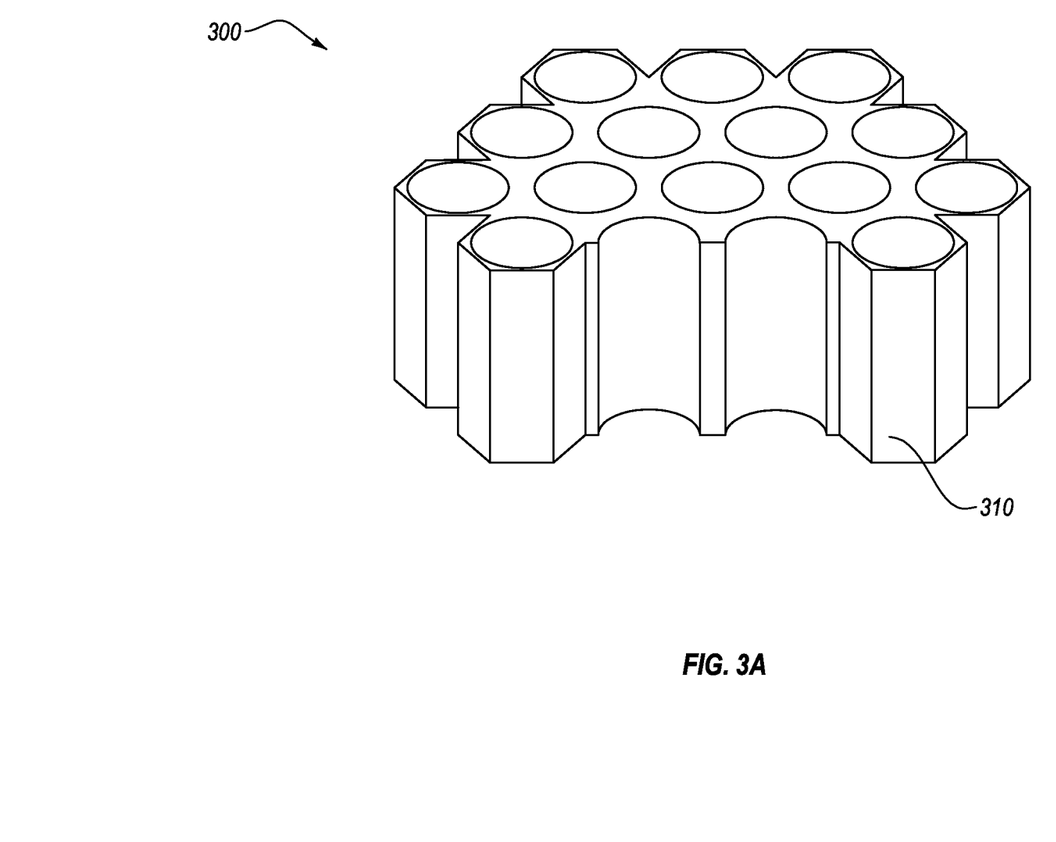
FIG. 3A illustrates a porous protective structure suitable for receiving layers of the multi-junction photosynthetic unit.
Figure 3B:
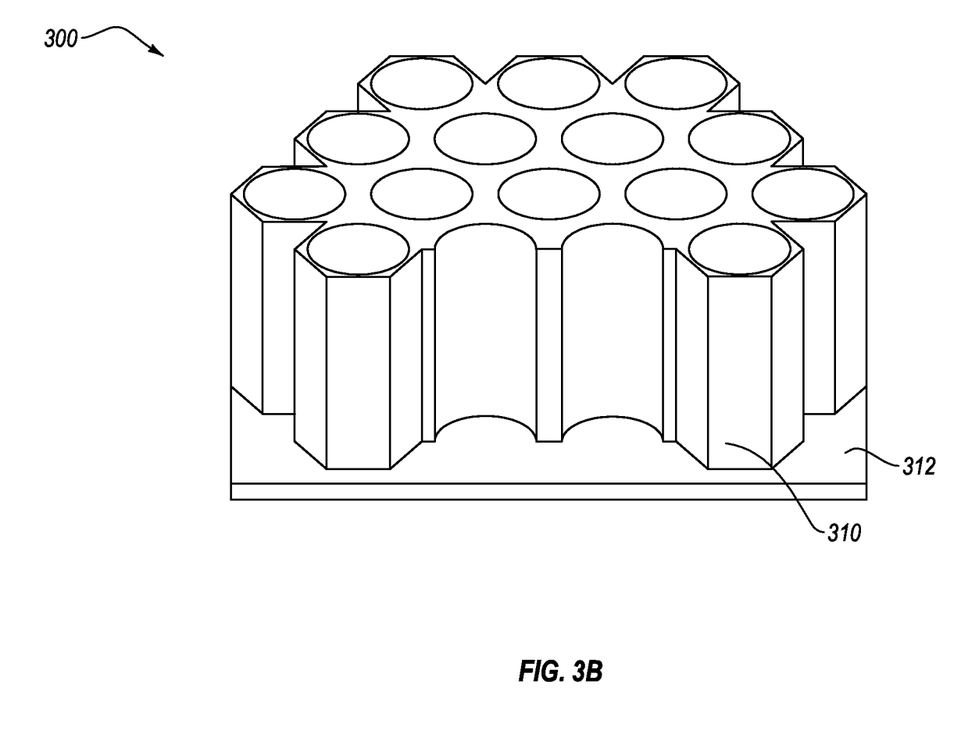
FIG. 3B illustrates a porous protective structure suitable for receiving layers of the multi-junction photosynthetic unit after deposition of a conducting backing layer.
Figure 3C:
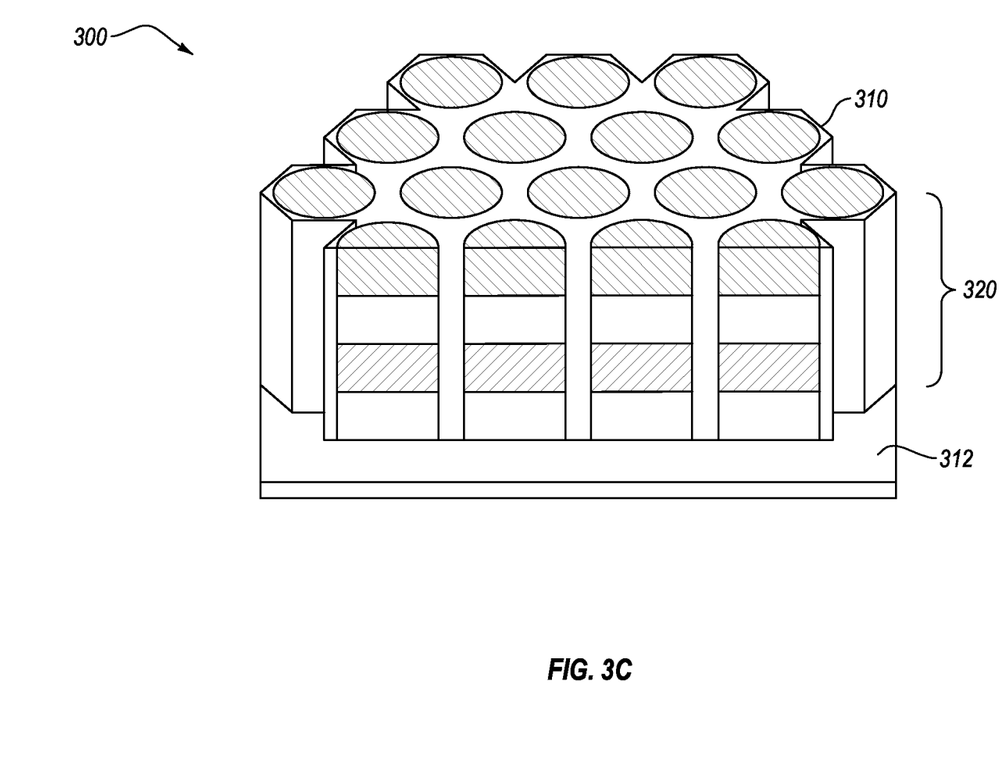
FIG. 3C illustrates an active element of multiple layers formed within a porous protective structure.

FIGS. 3A-3C illustrate a multi-junction photosynthetic unit 300 in various stages of formation. The foundation of these units 300 will be a visible light-absorbing semiconductor isolated from the supporting electrolyte by a protective structure 310. For example, the multi-junction photosynthetic unit can include a protective structure 310 in which layers forming an active element 320 of the multi-junction photosynthetic unit may be added. In some embodiments, the protective structure 310 is a porous oxide (e.g., porous anodic aluminum oxide) in which semiconductor materials, metal layers, and electrocatalyst layers may be added to form an active element 320 within the protective structure 310. For example, layers of the active element 320 may be electrodeposited within the porous structure of the protective structure 310 in successive fashion to form the functioning multi-junction photosynthetic unit 300. The protective structure 310 advantageously protects the active element from photo-corrosion and other corrosive effects of the electrolytic environment.

In preferred embodiments, the protective structure 310 is a porous aluminum oxide. In other embodiments, the protective structure 310 may be formed as track-etch polyester or polycarbonate (PC) templates, mesoporous silica and zeolite templates, and di-block co-polymeric templates.

FIG. 3B illustrates a porous protective structure 310 joined to a conducting substrate 312. In the illustrated embodiment, the conducting substrate 312 is formed onto one face of the protective structure 310. The conducting substrate 312 may then function as the working electrode (electrode of study) for electrodeposition of further layers forming the active element 320.

For example, the further layering can include a deposited electrocatalytic layer, followed by deposition of one or plurality of semiconductor layers, followed by deposition of an interfacial tunnel junction layers to create Schottky or ohmic junctions and capping the entire structure with deposition of another electrocatalyst layer. FIG. 3C illustrates an active element 320 including multiple layers 322 formed in this manner.

The conducting substrate 312 may be formed from a metal or a conducting polymer. In preferred embodiments, the conducting substrate 312 is formed from 5 d metals such as gold, platinum, and iridium. In preferred embodiments, the conducting substrate 312 is formed from 4 d metals such as silver, palladium, rhodium, ruthenium, and molybdenum. In preferred embodiments, the conducting substrate 312 is formed from 3 d metals such as titanium, iron, nickel, copper, cobalt, and manganese. The conducting substrate 312 may be formed using physical vapor deposition process such as electron beam deposition, sputter deposition, thermal evaporation, and pulsed laser deposition. The conducting substrate 312 may also be formed using chemical vapor deposition processes such as atomic layer chemical vapor deposition, plasma enhanced chemical vapor deposition, and microwave plasma-assisted deposition processes.

In other embodiments, an active element (such as illustrated active element 320) may be formed through a different process or combination of processes. For example, an active element 320 (or portions thereof) may be formed using electroless deposition, chemical/photochemical polymerization, sol-gel deposition, atmospheric pressure chemical vapor deposition, low-pressure chemical vapor deposition, high-pressure chemical vapor deposition, vapor phase epitaxy and molecular bean epitaxy.

Figure 4:
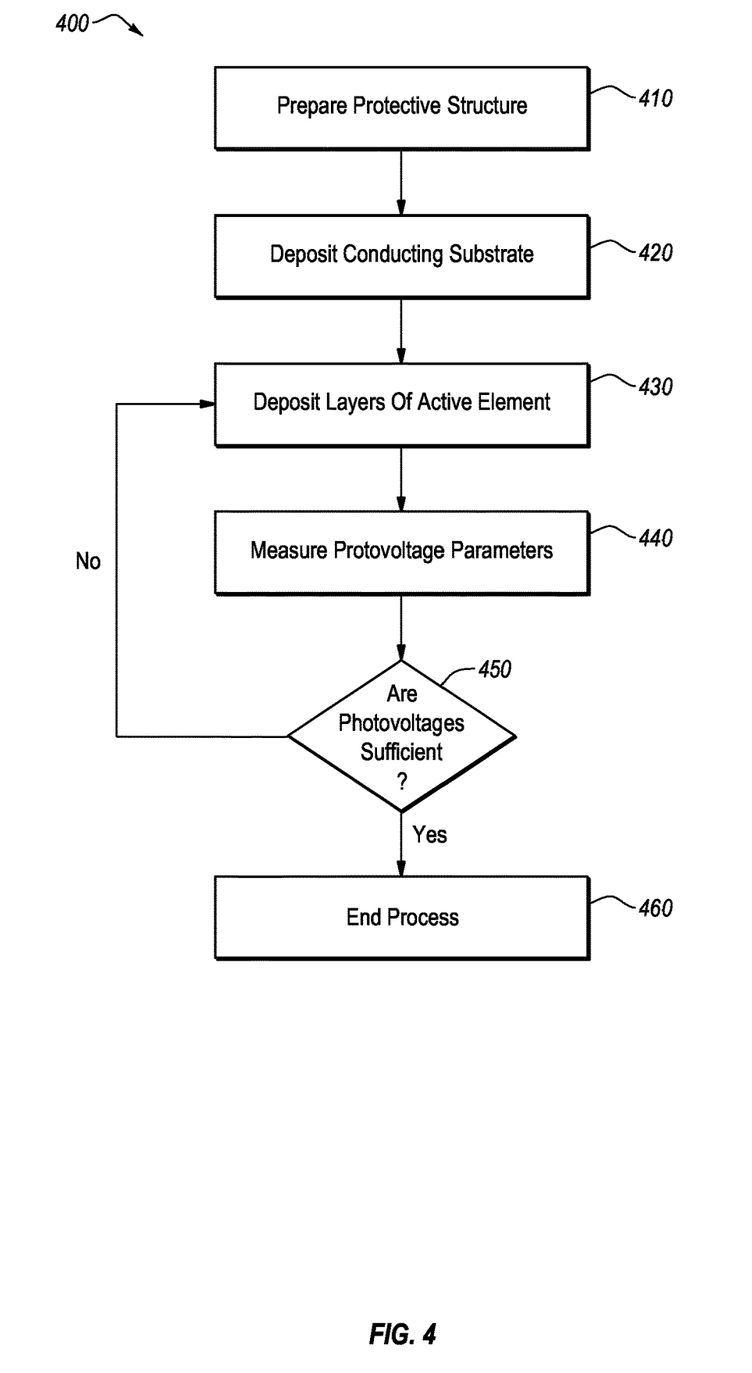
FIG. 4 illustrates a method of preparing a multi-junction photosynthetic unit of the present disclosure for use in providing a desired redox reaction.

An exemplary development method 400 for preparing a functional multi-junction photosynthetic unit for solar fuel production is illustrated schematically in FIG. 4. As illustrated, the process begins by preparing a porous protective structure 410. In preferred embodiments, this protective structure is formed from an aluminum oxide material. The process then deposits a conducting substrate 420 on one side or face of the porous protective structure. The conducting substrate may then function as the working electrode as the process deposits layers of the active element 430 within the protective structure. Multiple layers may then be deposited within the protective structure (e.g., via electrodeposition) in successive fashion to form the active element of the unit. For example, layering may proceed by depositing a light-absorbing semiconductor layer followed by one or more metal layers, followed by another light-absorbing semiconductor layer, and then followed by one or more additional metal layers.

After the formation of an active element, a user, computer, and/or machine may measure the photovoltage parameters 440 of the multi-junction unit, and based on the measured photovoltages, determine the sufficiency of the photovoltages 450 as to whether they are sufficient to drive the desired redox reactions. If the measured photovoltages are acceptable, the process will end 460. If the measured photovoltages are not acceptable, the process can deposit additional layers of the active element 430 within the protective structure until the desired photovoltages are realized. For example, in many embodiments, the desired photovoltage will be greater than or equal to about 1.2 volts. In other embodiments, greater photovoltages will be desired, such as from about 1.2 to about 1.6 volts, or from about 1.6 to about 2.0 volts, or from about 2.0 volts to about 2.5 volts or even greater than 2.5 volts.

III. Multi-Junction Active Element Embodiments

Figure 5:
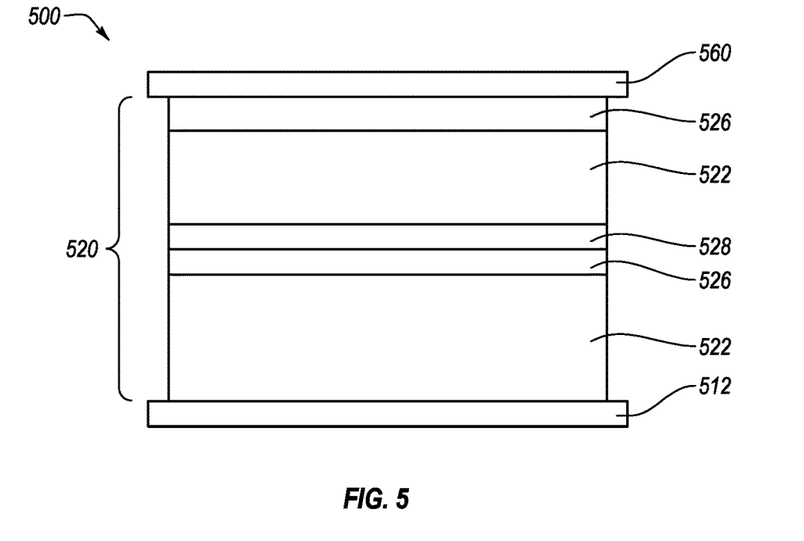
FIG. 5 illustrates an embodiment of a multi-junction photosynthetic unit having multiple layers.

FIG. 5 illustrates an embodiment of a multi-junction photosynthetic unit 500 including an active element 520 made from a plurality of vertically stacked semiconductor layers 522 (n- or p-type) of same or different materials having same or different thicknesses, a plurality of Schottky metal layers 526, each being disposed adjacent to a semiconductor layer 522 and each contacting a surface of the adjacent semiconductor layer 522 to form a Schottky barrier junction, and a plurality of ohmic metal layers 528, each being disposed adjacent to a semiconductor layer 522 and each contacting a surface of the adjacent semiconductor layer 522 to form an Ohmic contact junction.

For example, the active element 520 may be formed with a semiconductor layer 522 as the bottom layer deposited adjacent to (or on top of) a conducting substrate 512. The layering of the active element 520 can then include a Schottky metal layer 526 followed by an s ohmic metal layer 528 followed by an additional semiconductor layer 522. In the illustrated embodiment, the active element 520 is then layered with another Schottky metal layer 526. In some embodiments, the multi-junction photosynthetic unit can also include one or more oxidation/reduction electrocatalysts capping the unit, an ion-selective membrane covering the electrocatalyst(s), and/or a protective layer 560 that covers and protects the unit.

Figure 6:
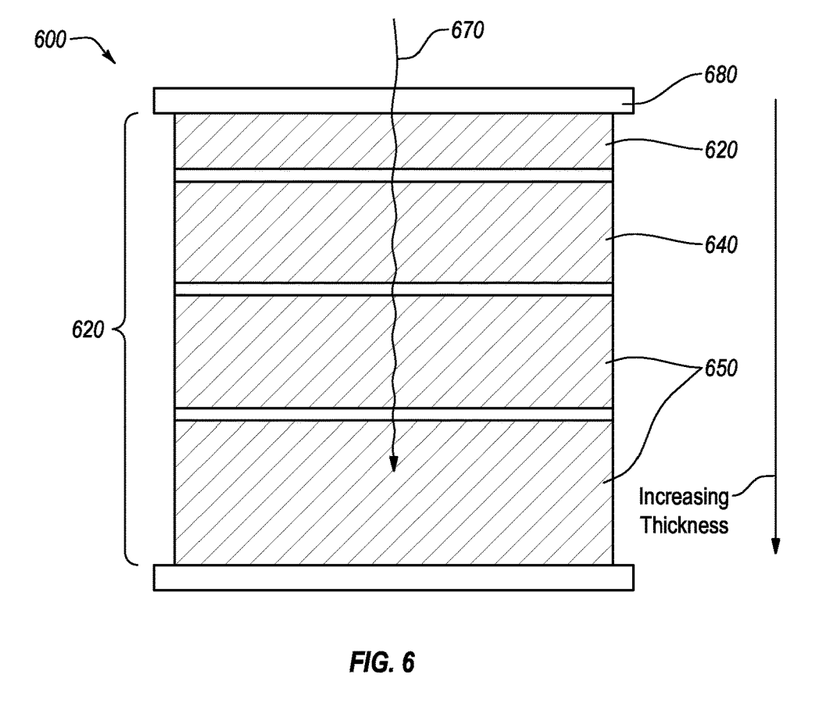
FIG. 6 illustrates an embodiment of a multi-junction photosynthetic unit having multiple layers with the same semiconductor material composition, with each successive semiconductor layer having a greater thickness than the preceding semiconductor layer.

FIG. 6 illustrates another embodiment of a multi-junction photosynthetic unit 600 including an active structure 620 having a first section 630 and a second section 640. The first section 630 is disposed in the unit 600 such that the first section 630 is the first section to receive light 670 incident upon the multi-junction unit 600. The first section 630 includes a first semiconductor layer having a first doping type (n- or p-type), having a first thickness, and producing a first photogenerated current output. The second section 640 is disposed adjacent the first section 630 and includes a second semiconductor layer being made of the same semiconductor composition as the first semiconductor layer, having the first doping type (n-or-p-type), and having a second thickness, where the second thickness is more than the first thickness, with the second thickness selected to produce a second photogenerated current output that is substantially equal to the first photogenerated current output.

The embodiment illustrated in FIG. 6 may also include one or more lower sections 650 adjacent to the second section 640, the lower section(s) made of a plurality of lower band-gap semiconductor material systems that have the same composition and same doping type as the first and second semiconductor layers (n-or-p-type), each successively of higher thicknesses and having a photogenerated current density at least equal to the one immediately above it.

In addition, the first section 630 and second section 640, and other lower sections 650, when included, can have Schottky and/or ohmic metal layers, with each Schottky metal layer forming a Schottky barrier with a surface of an adjacent semiconductor layer and each ohmic metal layer forming an ohmic contact with a surface of an adjacent semiconductor layer.

In the illustrated embodiment, for example, the semiconducting material can be an electrodeposited cadmium telluride (CdTe) film/nanostructure, an electrodeposited copper indium di-selenide ($CuInSe_2$) film/nanostructure, an electrodeposited cadmium selenide (CdSe) film/nanostructure, an electrodeposited cadmium sulfide (CdS) film/nanostructure, or an electrodeposited copper oxide ($Cu_2O$) film/nanostructure.

Metal layers forming ohmic junctions can be one or more metals selected from Group II B and Group III A of the periodic table (e.g., zinc, cadmium, mercury, boron, aluminum, gallium, and indium). Metal layers forming Schottky barrier junctions can be one or more metals selected from noble metal groups of the periodic table (e.g., platinum, palladium, rhodium, ruthenium, iridium, gold, silver, and copper).

The illustrated embodiment can also include an anode and cathode electrocatalyst 680 capping one or more ends. The anode and cathode electrocatalysts can be transition metals, noble metals, metal oxides, conducting polymers, perovskite and spinel type oxides, etc.

Figure 7:
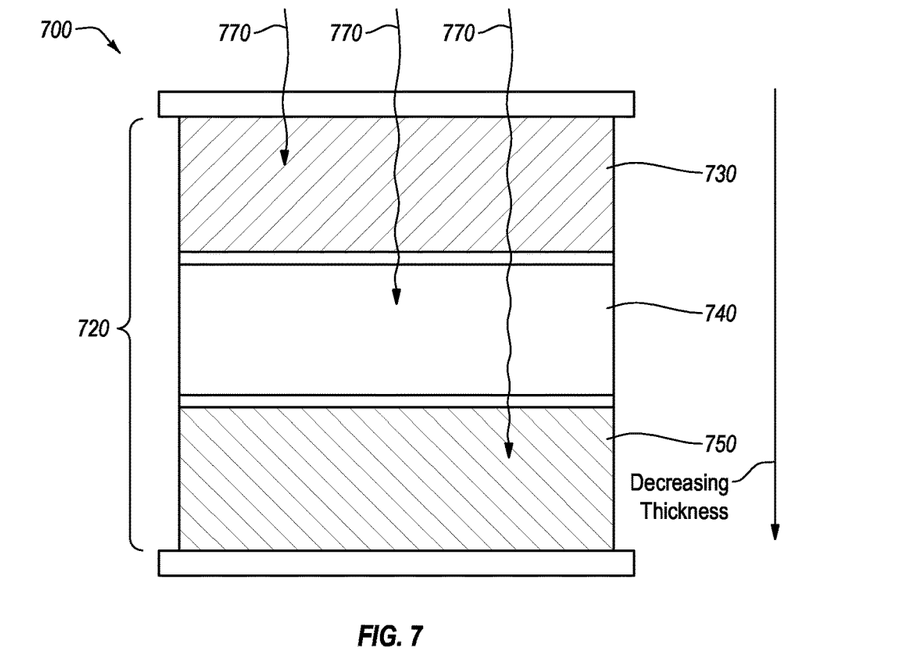
FIG. 7 illustrates an embodiment of a multi-junction photosynthetic unit having multiple layers of different semiconductor material composition, with each successive layer having a lower energy bandgap than the preceding layer.

FIG. 7 illustrates another embodiment of a multi-junction photosynthetic unit 700 including an active structure 720 having a first section 730 and a second section 740. The first section 730 is disposed in the unit 700 such that the first section 730 is the first section to receive light 770 incident upon the multi-junction unit 700. The first section 730 includes a first semiconductor layer (n-or-p-type), having a first thickness, having a first energy bandgap, and producing a first photogenerated current density. The second section 740 is disposed adjacent to the first section 730 and includes a second semiconductor layer being made of a second semiconducting material (different from the composition of the first semiconductor layer), producing a second photogenerated current density that is substantially equal to the first photogenerated current density, and having a second energy bandgap that is less than the first energy bandgap.

The embodiment illustrated in FIG. 7 may also include one or more lower sections 750 adjacent to the second section 740, the lower section(s) 750 made of a plurality of lower semiconductor material systems (n-or-p-type) that are different from the first and second semiconductor layers, each successively lower one of the lower sections 750 having an energy bandgap lower than the one immediately above it, and each successively lower one of the lower sections having a photogenerated current density at least equal to the one immediately above it.

In addition, the first section 730 and second section 740, and other lower sections 750, when included, can have Schottky and/or ohmic metal layers, with each Schottky metal layer forming a Schottky barrier with a surface of an adjacent semiconductor layer and each ohmic metal layer forming an ohmic contact with a surface of an adjacent semiconductor layer.

In the illustrated embodiment, the first semiconductor layer of the first section 730 can be formed from electrodeposited wide band gap metal oxides such as $Cu_2O$, ZnO, $TiO_2$, etc., and the second semiconductor layer of the second section 740 can be formed from electrodeposited CdSe, for example. The lower sections, when included, can include electrodeposited CdTe and $CuInSe_2$, for example. Examples include a 3-junction $Cu_2O$/CdSe/CdTe unit and a 4-junction $Cu_2O$/CdSe/CdTe/$CuInSe_2$ unit.

Figure 8:
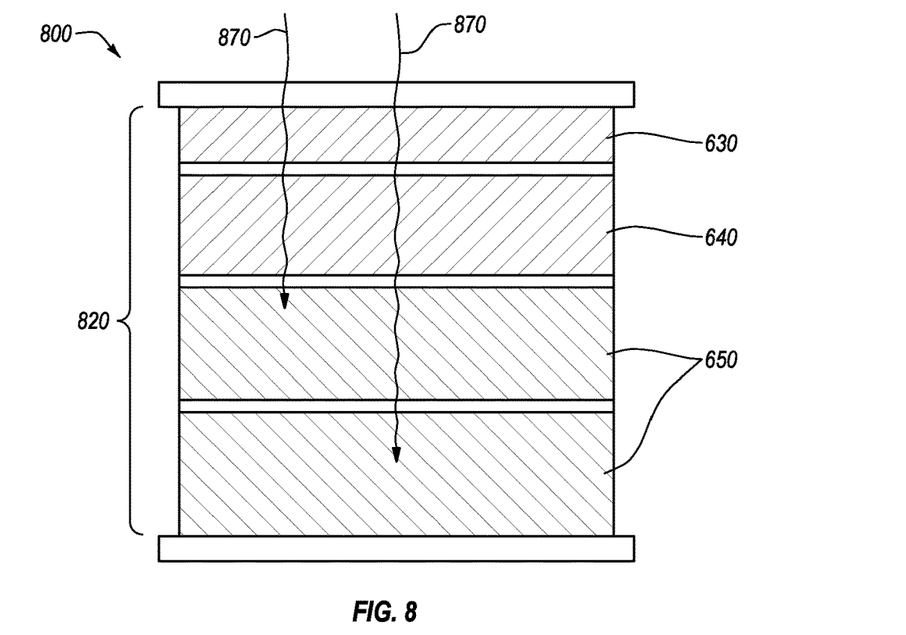
FIG. 8 illustrates another embodiment of a multi-junction photosynthetic unit having multiple layers, with first and second semiconductor layers being formed of the same materials and having different thicknesses, and a third semiconductor layer being formed with materials different from the first and second semiconductor layers.

FIG. 8 illustrates another embodiment of a multi-junction photosynthetic unit 800 including an active structure 820 having a first section 830 and a second section 840. The first section 830 is disposed in the unit 800 such that the first section 830 is the first section to receive light 870 incident upon the multi-junction unit 800. The first section 830 includes a first semiconductor layer made of a first semiconductor composition, having a first thickness and a first band gap energy, and producing a first photogenerated output. The second section 840 is disposed adjacent to the first section 830 and includes a second semiconductor layer being made of the same semiconductor composition as the first semiconductor layer, having a second thickness, and producing a second photogenerated current output that is substantially equal to the first photogenerated output.

The illustrated embodiment also includes at least one additional section 850 that is of different semiconductor composition than the composition of the first semiconductor layer 830, and has a different band gap energy than the first band gap energy.

In addition, the first section 830, second section 840, and at least one additional section 850 can have Schottky and/or ohmic metal layers, with each Schottky metal layer forming a Schottky barrier with a surface of an adjacent semiconductor layer and each ohmic metal layer forming an ohmic contact with a surface of an adjacent semiconductor layer.

Examples of the embodiment illustrated in FIG. 8 include a 5-junction $Cu_2O$/$Cu_2O$/CdSe/CdSe/CdTe unit, a 6-junction $Cu_2O$/$Cu_2O$/CdSe/CdSe/CdTe/$CuInSe_2$ unit, and a 7-junction $Cu_2O$/$Cu_2O$/$Cu_2O$/CdSe/CdSe/CdTe/$CuInSe_2$ unit.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope. Additionally, the elements and components of the embodiments disclosed herein may be combined and/or substituted, and are not intended to be confined to any particular embodiment.

The invention claimed is:

1. A multi junction artificial photosynthesis unit comprising:
   a protective structure comprising a plurality of cavities;
   a plurality of active elements, each active element formed in a corresponding cavity of the protective structure and extending between a first end and a second end, each active element comprising:
      a plurality of semiconductor layers arranged such that each successive semiconductor layer stacked within the active element is configured to generate a current density substantially equal to the current density of an adjacent semiconductor layer when the active element is exposed to solar radiation; and
      one or more metal layers disposed between each of the plurality of stacked semiconductor layers, each of the metal layers thereby forming a Schottky barrier junction or an ohmic junction with a surface of an adjacent semiconductor layer; and
      a first electrocatalyst cap disposed at the first end of each active element and a second electrocatalyst cap disposed at the second end of each active element.

2. The multi junction artificial photosynthesis unit of claim 1, further comprising a conducting substrate joined to one face of the protective structure, the conducting substrate functioning as a working electrode for further deposition of layers within the protective structure.

3. The multi junction artificial photosynthesis unit of claim 1, wherein the protective structure is formed as a porous aluminum oxide material.

4. The multi junction artificial photosynthesis unit of claim 1, wherein one or more metal layers associated with a first semiconductor layer include a first Schottky metal layer and a first ohmic metal layer disposed on opposite sides of the first semiconductor layer.

5. The multi junction artificial photosynthesis unit of claim 4, wherein one or more metal layers associated with a second semiconductor layer include a second Schottky metal layer disposed on a surface of the second semiconductor layer adjacent to the first ohmic metal layer.

6. The multi junction artificial photosynthesis unit of claim 1, wherein a first semiconductor layer and a second semiconductor layer adjacent to the first semiconductor layer have the same composition, and wherein the second semiconductor layer has a thickness that is greater than a thickness of the first semiconductor layer to thereby enable the second semiconductor layer to generate a current density substantially equal to the current density of the first semiconductor layer when the active element is exposed to solar radiation.

7. The multi junction artificial photosynthesis unit of claim 6, further comprising one or more lower sections disposed deeper within the active element relative to the second semiconductor layer, each having a semiconductor layer of the same composition as the first and second semiconductor layers, and each semiconductor layer of each lower section being of successively greater thickness as a distance from the first semiconductor layer increases.

8. The multi junction artificial photosynthesis unit of claim 6, wherein the first and second semiconductor layers are formed from one or more of cadmium telluride (CdTe), copper indium di-selenide ($CuInSe_2$), selenide (CdSe), cadmium sulfide (CdS), and copper oxide ($Cu_2O$).

9. The multi junction artificial photosynthesis unit of claim 1, wherein at least one of the one or more metal layers forms an ohmic junction with a surface of an adjacent semiconductor layer, and is formed from one or more of Group IIB and Group III A metals.

10. The multi junction artificial photosynthesis unit of claim 1, wherein at least one of the one or more metal layers forms a Schottky barrier junction with a surface of an adjacent semiconductor layer, and is formed from one or more noble metals.

11. The multi junction artificial photosynthesis unit of claim 1, wherein the first and second electrocatalyst caps are formed from materials selected from the group consisting of transition metals, noble metals, metal oxides, conducting polymers, perovskite, and spinel type oxides.

12. The multi junction artificial photosynthesis unit of claim 1, wherein a first semiconductor layer is formed of a first semiconductor material and has a first energy bandgap, and wherein a second semiconductor layer disposed deeper within the active element relative to the first semiconductor layer is formed of a second semiconductor material and has a second energy bandgap, the second energy bandgap being less than the first energy bandgap to thereby enable the second semiconductor layer to generate a current density substantially equal to the current density of the first semiconductor layer when the active element is exposed to solar radiation.

13. The multi junction artificial photosynthesis unit of claim 12, further comprising one or more lower sections disposed deeper within the active element relative to the second semiconductor layer, each lower section having a semiconductor layer formed of semiconductor materials different from the first and second semiconductor layers, and each semiconductor layer of each lower section being of successively lower energy bandgap as a distance from the first semiconductor layer increases.

14. The multi junction artificial photosynthesis unit of claim 12, wherein the first semiconductor layer is formed from one or more of $Cu_2O$, ZnO, and $TiO_2$, and wherein the second semiconductor layer is CdSe.

15. The multi junction artificial photosynthesis unit of claim 13, wherein the semiconductor layers of the one or more lower sections are formed from one or more of CdTe and $CuInSe_2$.

16. The multi junction artificial photosynthesis unit of claim 1, wherein a first semiconductor layer is formed of a first semiconductor material and has a first thickness and a first energy bandgap, and wherein one or more successive semiconductor layers disposed deeper within the active element relative to the first semiconductor layer are either:
 (i) formed of the first semiconductor material and have a second thickness, the second thickness being greater than the first thickness, or are
 (ii) formed of a second semiconductor material and have an energy bandgap less than the first energy bandgap.

17. A multi junction artificial photosynthesis unit comprising:
 a protective structure formed as a porous aluminum oxide and including a conducting substrate joined to one face of the protective structure; and
 a plurality of active elements each formed within a corresponding pore of the protective structure, each active element comprising:
  a first semiconductor layer formed of a first semiconductor material and having a first thickness and a first energy bandgap;
  one or more successive semiconductor layers disposed deeper within the active element relative to the first semiconductor layer, the one or more successive semiconductor layers being either
   (i) formed of the first semiconductor material and having a second thickness, the second thickness being greater than the first thickness, or
   (ii) formed of a second semiconductor material and having an energy bandgap less than the first energy bandgap;
  one or more metal layers disposed between each of the plurality of semiconductor layers, each of the metal layers thereby forming a Schottky barrier junction or an ohmic junction with a surface of an adjacent semiconductor layer; and
  a first electrocatalyst cap disposed at the first end of each active element and a second electrocatalyst cap disposed at the second end of each active element.

18. A photoreactor system for producing solar fuel from redox reaction products, the photoreactor system comprising:
 a plurality of multi junction artificial photosynthesis units as in claim 1;
 a vessel, the vessel containing the plurality of multi junction artificial photosynthesis units; and
 a feedstock contained within the vessel, the plurality of multi junction artificial photosynthetic units being fully or partially submerged within the feedstock.

* * * * *

UNITED STATES PATENT AND TRADEMARK OFFICE
CERTIFICATE OF CORRECTION

PATENT NO. : 10,100,415 B2
APPLICATION NO. : 14/659243
DATED : October 16, 2018
INVENTOR(S) : Hussaini et al.

Page 1 of 1

It is certified that error appears in the above-identified patent and that said Letters Patent is hereby corrected as shown below:

In the Specification

<u>Column 2</u>
Line 29, change "forma" to –from a–

Signed and Sealed this
Eighth Day of January, 2019

Andrei Iancu
*Director of the United States Patent and Trademark Office*